(12) United States Patent
Sasaki et al.

(10) Patent No.: US 9,343,263 B2
(45) Date of Patent: May 17, 2016

(54) ION IMPLANTER, BEAM ENERGY MEASURING DEVICE, AND METHOD OF MEASURING BEAM ENERGY

(71) Applicant: Sumitomo Heavy Industries Ion Technology Co., Ltd., Tokyo (JP)

(72) Inventors: Haruka Sasaki, Ehime (JP); Kazuhiro Watanabe, Ehime (JP); Hiroyuki Kariya, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/656,132

(22) Filed: Mar. 12, 2015

(65) Prior Publication Data

US 2015/0262787 A1    Sep. 17, 2015

(30) Foreign Application Priority Data

Mar. 14, 2014 (JP) .................................. 2014-052176

(51) Int. Cl.
*H01J 37/00* (2006.01)
*H01J 37/244* (2006.01)
*H01J 37/317* (2006.01)

(52) U.S. Cl.
CPC ........... *H01J 37/244* (2013.01); *H01J 37/3171* (2013.01); *H01J 2237/057* (2013.01); *H01J 2237/24514* (2013.01); *H01J 2237/24528* (2013.01); *H01J 2237/31703* (2013.01)

(58) Field of Classification Search
CPC ................ H01J 37/244; H01J 37/3171; H01J 2237/24514; H01J 2237/24528; H01J 2237/057; H01J 2237/31703
USPC .......... 250/396 R, 397, 396 ML, 492.1–492.3
See application file for complete search history.

(56) References Cited

U.S. PATENT DOCUMENTS 7,429,743 B2 * 9/2008 Kabasawa ............. H01J 27/024
250/396 ML

FOREIGN PATENT DOCUMENTS

| JP | S49-99158 A | 8/1974 |
| JP | S55-3643 Y2 | 1/1980 |
| JP | H03-272557 A | 12/1991 |
| JP | 2748869 B2 | 5/1998 |
| JP | 4432003 B2 | 3/2010 |

* cited by examiner

*Primary Examiner* — Michael Maskell
(74) *Attorney, Agent, or Firm* — Michael Best & Friedrich LLP

(57) ABSTRACT

A beam energy measuring device in an ion implanter includes a parallelism measuring unit that measures a parallelism of an ion beam at a downstream of a beam collimator of the ion implanter and an energy calculating unit that calculates an energy of the ion beam from the measured parallelism. The ion implanter may further include a control unit that controls a high energy multistage linear acceleration unit based on the measured energy of the ion beam so that the ion beam has a target energy.

21 Claims, 14 Drawing Sheets

FIG.13
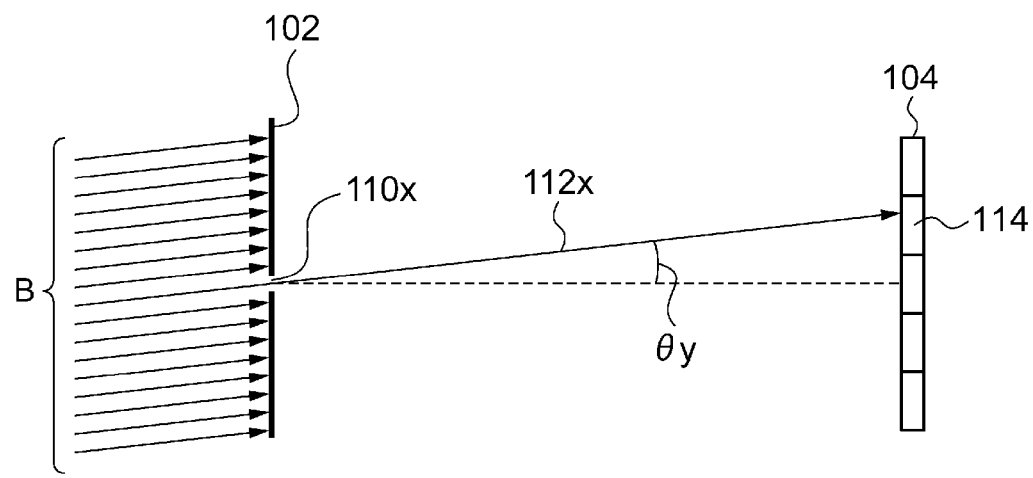
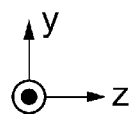

ION IMPLANTER, BEAM ENERGY MEASURING DEVICE, AND METHOD OF MEASURING BEAM ENERGY

RELATED APPLICATION

Priority is claimed to Japanese Patent Application No. 2014-52176, filed on Mar. 14, 2014, the entire content of which is incorporated herein by reference.

BACKGROUND OF THE INVENTION

1. Field of the Invention

The present invention relates to an ion implanter, a beam energy measuring device, and a method of measuring beam energy.

2. Description of the Related Art

An ion implanter is provided with a device for measuring energy of an ion beam in some cases. For example, an energy measuring device measures time-of-flight of an ion at a predetermined distance, derives a speed of the ion from the distance and the measured time-of-flight, and calculates energy of the ion with use of the speed. Also, another measuring device measures energy of an ion beam from a characteristic X-ray generated when the ion beam is bombarded to a target.

Each of the above measuring devices additionally requires a dedicated configuration for energy measurement. For example, in the case of measuring time-of-flight of the ion, two sensors arranged away from each other at a predetermined distance are used. The respective sensors detect passage of the ion, and a time difference thereof is regarded as time-of-flight of the ion. Also, in the case of detecting the characteristic X-ray, a dedicated target for generating the characteristic X-ray and an X-ray detector are required. In general, addition of a new configuration to the ion implanter may cause an increase in manufacturing cost of the ion implanter.

SUMMARY OF THE INVENTION

An illustrative object of an aspect of the present invention is to enable energy measurement of an ion beam without a significant increase in cost in an ion implanter.

According to one aspect of the present invention, there is provided an ion implanter including: a beam collimator that has a focus on a beam reference trajectory and deflects a plurality of beam trajectories, directed from the focus to the beam collimator at different respective incident angles on a plane containing the beam reference trajectory, at different deflection angles in accordance with the respective incident angles so that each of the plurality of beam trajectories is parallel to the beam reference trajectory under a target beam energy; a parallelism measuring unit that measures a beam parallelism, representing an error of a beam angle in a direction in the plane, the direction being perpendicular to the beam reference trajectory, of an ion beam passing through the beam collimator at a downstream of the beam collimator; and an energy calculating unit that calculates an energy deviation amount of the ion beam from the target beam energy based on the beam parallelism.

According to another aspect of the present invention, there is provided a beam energy measuring device in an ion implanter including: a parallelism measuring unit that measures a beam parallelism at a downstream of a beam collimator of the ion implanter; and an energy calculating unit that calculates an energy deviation amount of an ion beam from a target beam energy based on the beam parallelism and a known relationship defined with use of the target beam energy.

According to another aspect of the present invention, there is provided a method of measuring beam energy including: measuring a beam parallelism at a downstream of a beam collimator in an ion implanter; and calculating an energy deviation amount of an ion beam from a target beam energy based on the beam parallelism and a known relationship defined with use of the target beam energy.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which:

FIG. 13 is a diagram that is acquired when the parallelism measuring unit illustrated in FIG. 10 is cut at a position of an x slit of the mask in the x direction and is viewed in the x direction.

DETAILED DESCRIPTION OF THE INVENTION

Figure 1:
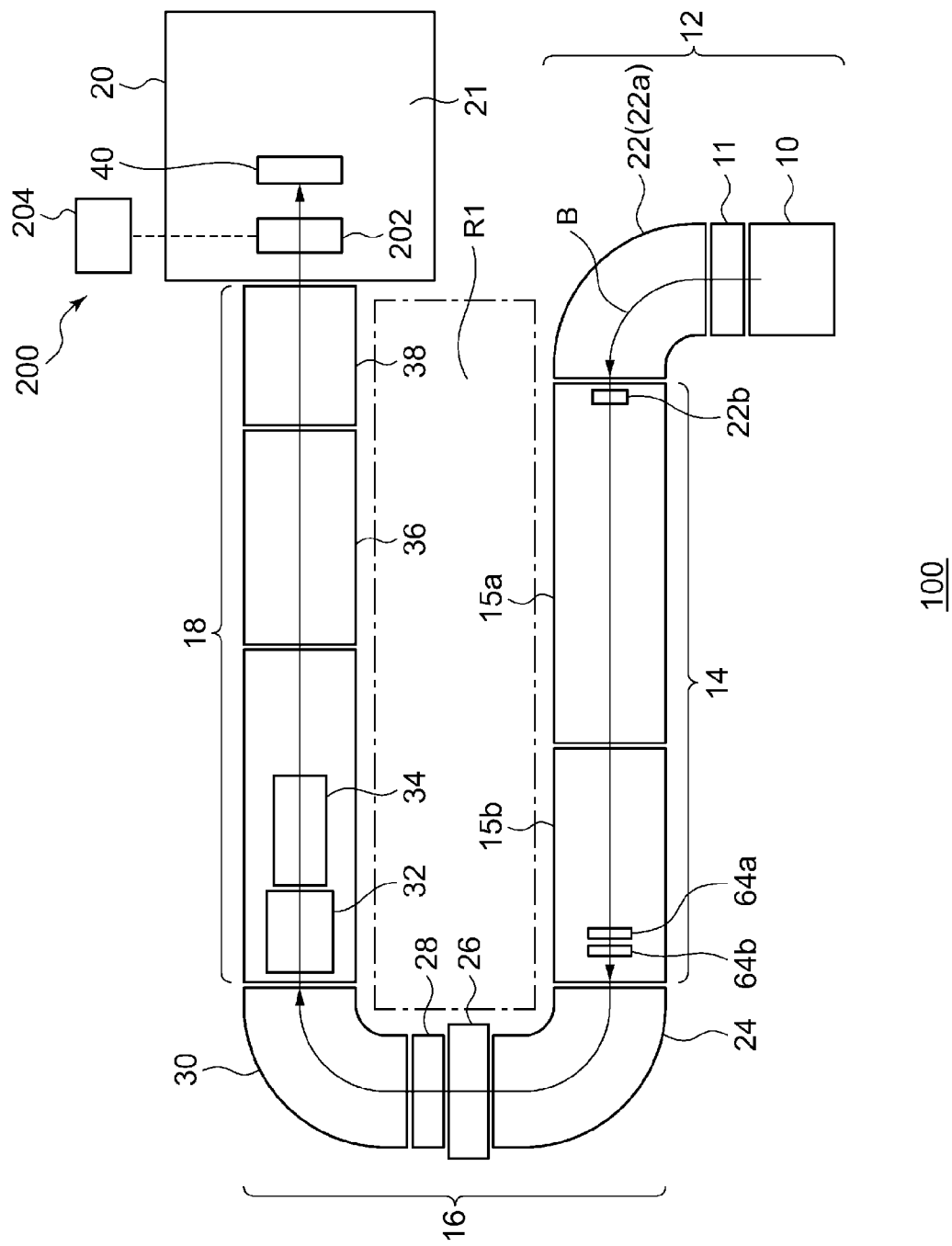
FIG. 1 is a top view schematically illustrating an ion implanter according to an embodiment of the present invention.

The invention will now be described by reference to the preferred embodiments. This does not intend to limit the scope of the present invention, but to exemplify the invention.

Hereinafter, embodiments of the present invention will be described in detail with reference to the drawings. The same reference sign will be assigned to the same element in the drawings, and duplicate description thereof will not be presented as is appropriate. The configurations described below are merely examples but are not for purposes of limiting the scope of the present invention.

FIG. 1 is a schematic top view of an ion implanter 100 according to an embodiment of the present invention. The ion implanter 100 is suitably used as a high energy ion implanter. The high energy ion implanter is provided with an ion accelerator of high-frequency linear acceleration type and a high energy ion transportation beamline. The high energy ion implanter accelerates ions generated by an ion source 10, transports a resultant ion beam B to a workpiece (e.g., a substrate or a wafer 40) along the beamline, and implants ions into the workpiece.

FIG. 1 shows a layout of components constituting a beamline unit of the ion implanter 100. The beamline unit of the ion implanter 100 includes an ion source 10 and a processing chamber 21 for performing an ion implantation process for the workpiece. The beamline unit is configured to transport the ion beam B from the ion source 10 to the workpiece.

As shown in FIG. 1, the high energy ion implanter 100 comprises an ion beam generation unit 12 configured to generate ions and subject the ions to mass separation; a high energy multistage linear acceleration unit 14 configured to accelerate the ion beam to obtain a high energy ion beam; a beam deflection unit 16 configured to analyze the energy of the high energy ion beam, adjust the reference trajectory thereof, and control the energy spread thereof; a beam transportation line unit 18 configured to transport the analyzed high energy ion beam to the wafer 40; and a substrate processing and supplying unit 20 configured to uniformly implant the transported high energy ion beam into a semiconductor wafer.

The ion beam generation unit 12 is provided with an ion source 10, an extraction electrode 11, and a mass analyzer 22. The ion beam generation unit 12 is configured to extract a beam from the ion source 10 by the extraction electrode 11 and accelerate the extracted beam. The extracted and accelerated beam is subject to mass analysis by the mass analyzer 22. The mass analyzer 22 is provided with a mass analyzer magnet 22a and a mass analyzing slit 22b. The mass analyzing slit 22b may be placed immediately after the mass analyzer magnet 22a. According to this embodiment, the mass analyzing slit 22b is placed inside the entrance of the high energy multistage linear acceleration unit 14 in the next stage. Only the ion species necessary for implantation is selected in mass analysis by the mass analyzer 22. The ion beam comprised of the selected ion species is guided to the high energy multistage acceleration unit 14 in the next stage.

Figure 2:
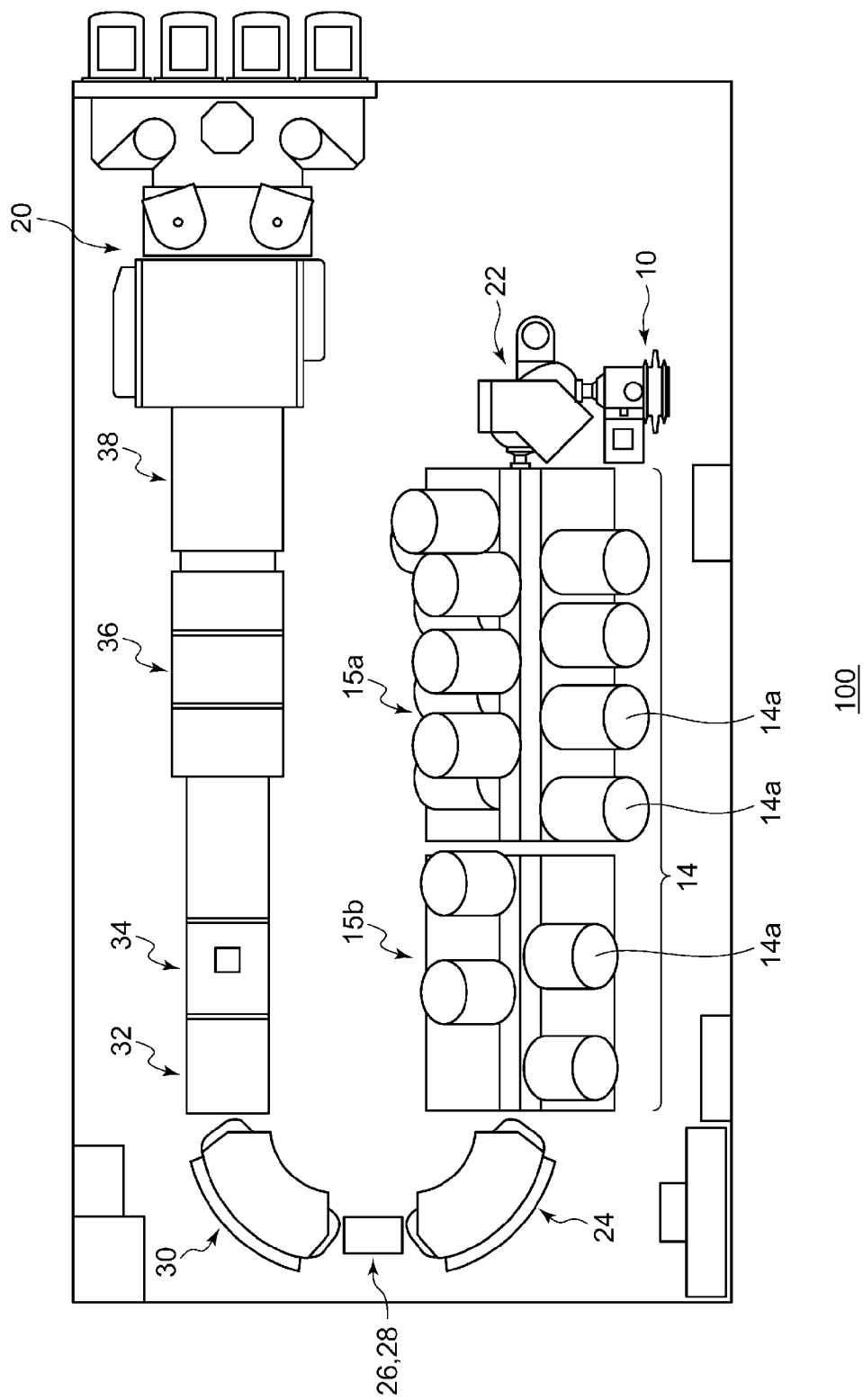
FIG. 2 is a plan view illustrating an entire layout including a schematic configuration of a high energy multistage linear acceleration unit illustrated in FIG. 1.

FIG. 2 is a plan view illustrating an entire layout including a schematic configuration of the high energy multistage linear acceleration unit 14. The high energy multistage linear acceleration unit 14 includes a plurality of linear accelerators for accelerating the ion beam, that is, an acceleration gap whose potential is excited by one or more radio frequency resonators 14a. The high energy multistage linear acceleration unit 14 may accelerate the ions by the action of the radio frequency (RF) electric field.

The high energy multistage linear acceleration unit 14 includes a first linear accelerator 15a including a plurality of stages of basic radio frequency resonators 14a for high energy ion implantation. The high energy multistage linear acceleration unit 14 may include a second linear accelerator 15b including a plurality of additional stages of radio frequency resonators 14a for ultra high energy ion implantation. The direction of the ion beam further accelerated by the high energy multistage linear acceleration unit 14 is changed by the beam deflection unit 16.

Meanwhile, in the ion implanter that uses the acceleration of the radio frequency (RF), the amplitude V [kV] and the frequency f [Hz] of the voltage need to be considered as the parameter of the radio frequency. Further, in a case where a multi-stage radio frequency acceleration is performed, the phase difference φ [deg] between adjacent radio frequency resonators is added as the parameter. In addition, a magnetic field lens (for example, an electrostatic quadrupole electromagnet) or an electric field lens (for example, an electric field quadrupole electrode) is needed so as to control the expansion of the ion beam in the vertical and horizontal directions during or after the acceleration by the focusing/defocusing effect. Then, the optimal values of the operation parameters of the lenses are changed by the ion energy passing therethrough, and the strength of the acceleration electric field influences the focusing/defocusing action. For this reason, these values are determined after the parameter of the radio frequency is determined.

Figure 3:
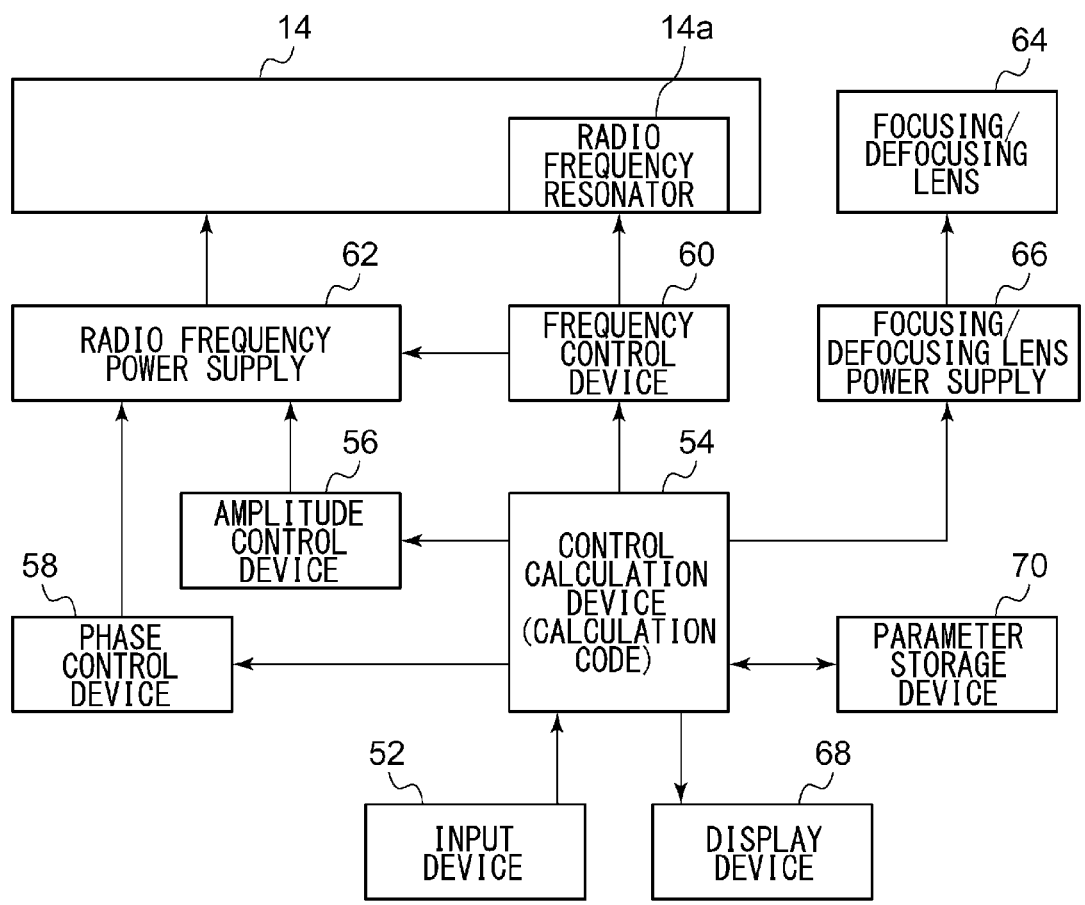
FIG. 3 is a block diagram illustrating a function and configuration of a control unit of the high energy multistage linear acceleration unit illustrated in FIG. 1.

FIG. 3 is a block diagram illustrating a configuration of a control unit 120 of the focusing/defocusing lens and the high energy multistage linear acceleration unit obtained by linearly arranging the acceleration electric fields (the gaps) at the front ends of the plurality of radio frequency resonators.

The high energy multistage linear acceleration unit 14 includes one or more radio frequency resonators 14a. As the components necessary for the control of the high energy multistage linear acceleration unit 14, an input device 52 for allowing an operator to input a necessary condition, a control calculation device 54 that numerically calculates various parameters from the input condition and controls the components, an amplitude control device 56 that adjusts the voltage amplitude of the radio frequency, a phase control device 58 that adjusts the phase of the radio frequency, a frequency control device 60 that controls the frequency of the radio frequency, a radio frequency power supply 62, a focusing/defocusing lens power supply 66 for a focusing/defocusing lens 64, a display device 68 that displays an operation parameter thereon, and a storage device 70 that stores the determined parameter are needed. Further, the control calculation device 54 stores therein a numerical calculation code (a program) for numerically calculating various parameters in advance.

In the control calculation device 54 of the radio frequency linear accelerator, radio frequency parameters (an amplitude, a frequency, and a phase of a voltage) are calculated so as to obtain the optimal transportation efficiency by simulating the acceleration, the focusing, and the defocusing of the ion beam based on the input condition and the numerical calculation code stored therein. Also, the parameter (a Q coil current or a Q electrode voltage) of the focusing/defocusing lens 64 that is used to efficiently transport the ion beam is also calculated. The calculated various parameters are displayed on the display device 68. The display device 68 displays a non-answerable mark for the acceleration condition that exceeds the ability of the high energy multistage linear acceleration unit 14.

The voltage amplitude parameter is transmitted from the control calculation device 54 to the amplitude control device 56, and the amplitude control device 56 adjusts the amplitude of the radio frequency power supply 62. The phase parameter is transmitted to the phase control device 58, and the phase control device 58 adjusts the phase of the radio frequency power supply 62. The frequency parameter is transmitted to the frequency control device 60. The frequency control device 60 controls the output frequency of the radio frequency power supply 62, and controls the resonance frequency of the radio frequency resonator 14a of the high energy multistage linear acceleration unit 14. Further, the control calculation device 54 controls the focusing/defocusing lens power supply 66 by the calculated focusing/defocusing lens parameter.

The focusing/defocusing lens 64 that is used to efficiently transport the ion beam is disposed as many as needed at a position inside the radio frequency linear accelerator or a position before and behind the radio frequency linear accelerator. That is, the defocusing lens and the focusing lens are alternately provided at the position before and behind the acceleration gap of the front end of the multi-stage radio frequency resonator 14a. An additional vertical focusing lens 64b is disposed behind the horizontal focusing lens 64a at the termination end of the second linear accelerator 15b, adjusts the focusing and the defocusing of the high energy acceleration ion beam passing through the high energy multistage linear acceleration unit 14, and causes the ion beam having an optimal two-dimensional beam profile to be incident to the beam deflection unit 16 of the rear stage.

As illustrated in FIGS. 1 and 2, the beam deflection unit 16 includes an energy analyzer electromagnet 24, a horizontal focusing quadrupole lens 26 configured to reduce energy spread, an energy analyzer slit 28, and a deflecting electromagnet 30 configured to provide steering (trajectory adjustment). The energy analyzer electromagnet 24 may be referred to as an energy filter electromagnet (EFM). The direction of the high energy ion beam is changed by the beam deflection unit 16, causing the high energy ion beam to travel toward the wafer 40.

The beam transportation line unit 18 is configured to transport the ion beam B exiting from the beam deflection unit 16 and is provided with a beam focusing/defocusing device 32 comprised of a group of focusing/defocusing lenses, a beam scanner 34, a beam collimator 36, a final energy filter 38 (including a final energy separation slit). The length of the beam transportation line unit 18 is designed to adapt to the total length of the ion beam generation unit 12 and the high energy multistage linear acceleration unit 14. The beam transportation line unit 18 is coupled to the assembly of the ion beam generation unit 12 and the high energy multistage linear acceleration unit 14 via the beam deflection unit 16, producing an overall U-shaped layout.

The substrate processing and supplying unit 20 is provided at the downstream end of the beam transportation line unit 18. In a processing chamber 21 of the substrate processing and supplying unit 20 are accommodated a beam monitor for measuring the ion beam B's beam current, position, angle of implantation, convergence/divergence angle, and ion distribution in the vertical and horizontal directions; a static charge prevention device for preventing the wafer 40 from being charged by the ion beam B; a wafer transportation mechanism for transporting the wafer 40 into and out of the processing chamber and placing the wafer 40 at a proper position and angle; an electro static chuck (ESC) for supporting the wafer 40 during ion implantation; and a wafer scan mechanism for moving the wafer 40 during implantation in a direction perpendicular to the direction of beam scan at a speed determined by variation in the beam current.

Thus, the beamline unit of the ion implanter 100 is configured as a horizontal U-shaped folded-back beamline having two elongated straight portions facing each other. The upstream straight portion is comprised of a plurality of units for accelerating the ion beam B generated by the ion source 10. The downstream straight portion is comprised of a plurality of units for adjusting the ion beam B with its course changed from the course traveled in the upstream straight portion and implanting the ion beam B into the wafer 40. The two straight portions are configured to have substantially the same length. A work space R1 having a room sufficiently large for maintenance work is provided between the two straight portions.

In this way, the high energy ion implanter 100 that is formed by arranging the units in a U-shape ensures satisfactory workability while suppressing an increase in foot print. Further, in the high energy ion implanter 100, the units or the devices are formed as a module, and hence may be attached, detached, and assembled in accordance with the beamline reference position.

Since the high energy multistage acceleration unit 14 and the beam transportation line unit 18 are arranged in a folded-back layout, the overall length of the high energy ion implanter 100 is minimized. In the related-art devices, the units are arranged substantially in a linear layout. The radius of curvature of the plurality of deflecting electromagnets forming the beam deflection unit 16 is optimally configured to minimize the width of the implanter. These measures minimize the foot print of the implanter and makes it possible to do a maintenance work on the components of the high energy multistage linear accelerator unit 14 and the beam transportation line unit 18 in the work space R1 sandwiched by the high energy multistage linear acceleration unit 14 and the beam transportation line unit 18. Because the ion source 10, which is characterized by relatively short maintenance intervals, and the substrate processing and supplying unit 20, in which a substrate needs to be supplied/retrieved, are arranged adjacent to each other, an operator does not need to move a lot.

Figure 4:
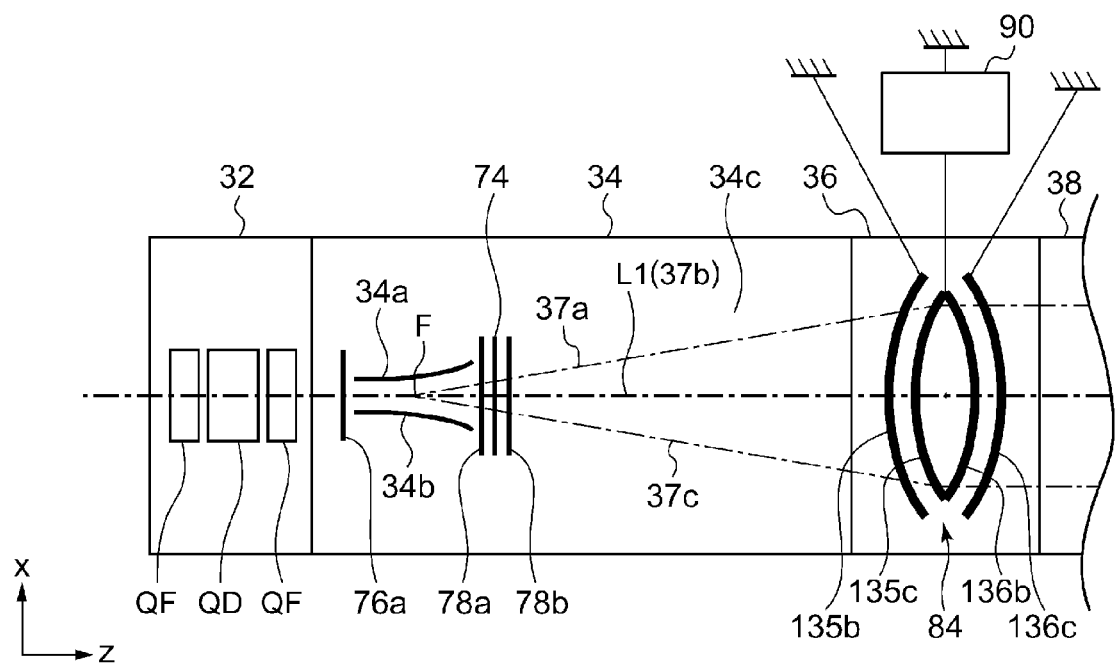
FIG. 4 is a plan view illustrating a partial schematic configuration of a beam transportation line unit illustrated in FIG. 1.

FIG. 4 is a plan view illustrating a partial schematic configuration of the beam transportation line unit 18. Only the necessary ion species are separated by the beam deflection unit 16 (refer to FIG. 1), and the beam that is formed only by the ions having a necessary energy value is focused/defocused in a desired cross-sectional shape by the beam focusing/defocusing device 32. As illustrated in the figure, the beam focusing/defocusing device 32 is configured as (an electric field type or a magnetic field type) focusing/defocusing lens group such as a Q (quadrupole) lens. The beam having a focused/defocused cross-sectional shape is scanned in a direction parallel to the surface of FIG. 4 by the beam scanner 34. For example, the beam focusing/defocusing device is configured as a triplet Q lens group including a horizontal focusing (vertical defocusing) lens QF/a horizontal defocusing (vertical focusing) lens QD/a horizontal focusing (vertical defocusing) lens QF. If necessary, the beam focusing/defocusing device 32 may be configured by each of the horizontal focusing lens QF and the horizontal defocusing lens QD or the combination thereof.

The beam scanner 34 is a deflection scan device that causes the ion beam to periodically scan in the horizontal direction perpendicular to the ion beam traveling direction in a reciprocating manner by the periodically changing electric field.

The beam scanner 34 includes a pair of (two) counter electrodes 34a, 34b (bipolar deflection scan electrodes) that are disposed so as to face each other with the ion beam passage region interposed therebetween in the beam traveling direction. Then, a scan voltage that changes to positive and negative values at a predetermined frequency in the range of 0.5 Hz to 4000 Hz and is approximated to the triangular wave is applied to two counter electrodes 34a, 34b with signs of the voltage being opposite each other. The scan voltage generates a changing electric field that deflects the beam passing through the gap between two counter electrodes 34a, 34b. Then, the beam that passes through the gap is scanned in the horizontal direction by the periodic change of the scan voltage.

The suppression electrode 74 that includes an opening in the ion beam passage region is disposed between two ground electrodes 78a and 78b at the downstream side of the beam scanner 34. The ground electrode 76a is disposed before the scan electrode at the upstream side thereof, but if necessary, the suppression electrode having the same configuration as that of the downstream side may be disposed. The suppression electrode suppresses the intrusion of electrons to the positive electrode.

A beam scan space portion 34c is provided in a long section at the downstream side of the beam scanner 34 inside a scan housing, and hence a sufficient scan width may be obtained even when the beam scan angle is narrow. At the rear side of the scan housing located at the downstream side of the beam scan space portion 34c, the deflected ion beam is adjusted to be directed to the direction of the ion beam before the beam is deflected. That is, the beam collimator 36 is installed which deflects the beam so as to be parallel to a beamline L1.

Since the aberration generated in the beam collimator 36 (a difference in focal distance between the center portion and right/left ends of the beam collimator) is proportional to the square of the deflection angle of the beam scanner 34, the aberration of the beam collimator 36 may be largely suppressed when the beam scan space portion 34c is increased in length and the deflection angle is decreased. If the aberration is large, the center portion and the right and left ends of the semiconductor wafer have different beam sizes and beam divergence angles when the ion beam is implanted into the semiconductor wafer, and hence the quality of the product becomes non-uniform.

Further, when the length of the beam scan space portion 34c is adjusted, the length of the beam transportation line unit may match the length of the high energy multistage linear acceleration unit 14.

The beam collimator 36 is provided with an electric field collimating lens 84. As illustrated in FIG. 4, the electric field collimating lens 84 includes a plurality of pairs of acceleration electrodes and a plurality of pairs of deceleration electrodes substantially having a hyperbolic shape. The electrodes of each pair face each other across an acceleration/deceleration gap interposed therebetween and having a width not causing a discharge. An electric field having an axial element causing acceleration or deceleration of the ion beam and a lateral element strengthened in proportional to a distance from the reference axis and influencing the horizontal focusing of the ion beam is formed in the acceleration/deceleration gap.

The downstream electrode in the pair of electrodes with the acceleration gap interposed therebetween and the upstream electrode of the deceleration gap are formed as an integrated structure, and the downstream electrode of the deceleration gap and the upstream electrode of the next acceleration gap are formed as an integrated structure, so as to have the same potential.

From the upstream side of the electric field collimating lens 84, the first electrode (the entrance electrode) and the final electrode (the exit electrode) are maintained at the ground potential. Accordingly, the energy of the beam at the positions before and behind the collimating lens 84 does not change.

In the intermediate electrode structure, the exit electrode of the acceleration gap and the entrance electrode of the deceleration gap are connected with a negative power supply 90 having a variable constant voltage, and the exit electrode of the deceleration gap and the entrance electrode of the acceleration gap are connected with a positive power supply having a variable constant voltage (in a case of n stages, negative, positive, negative, positive, negative, and the like). Accordingly, the ion beam is gradually directed toward the direction parallel to the reference trajectory of the beamline while being accelerated and decelerated repeatedly. Finally, the ion beam reaches the trajectory parallel to the ion beam traveling direction (the beamline trajectory direction) before the deflection scanning operation.

As illustrated in FIG. 4, the beam collimator 36 has a focus F on the beam reference trajectory (e.g., the beamline L1 illustrated in FIG. 4) in design. A plurality of beam trajectories 37a, 37b, and 37c incident to the beam collimator 36 respectively have different angles from the beam reference trajectory. The beam collimator 36 is designed to deflect each of the plurality of beam trajectories 37a, 37b, and 37c at a different deflection angle in accordance with the incident angle so that the plurality of beam trajectories 37a, 37b, and 37c is parallel to the beam reference trajectory. The beam collimator is operated upon an electric input (e.g., voltage) predetermined in accordance with predetermined conditions of ion implantation (e.g., conditions including target beam energy).

The plurality of beam trajectories 37a, 37b, and 37c are on a plane containing the beam reference trajectory, on which the beam trajectories 37a, 37b, and 37c are respectively directed from the focus F to the beam collimator 36 at different incident angles. Since the plurality of beam trajectories 37a, 37b, and 37c are results of scanning by the beam scanner 34 in the present embodiment, this plane is equivalent to a scan plane (an xz plane) of the beam scanner 34. Any of the beam trajectories (the beam trajectory 37b in FIG. 4) may correspond to the beam reference trajectory. In the present embodiment, the beam reference trajectory is not deflected in the beam collimator 36 but goes straight in the beam collimator 36.

The ion implanter 100 according to the present embodiment is configured so that the focus F of the beam collimator corresponds to a scan origin of the beam scanner 34. Accordingly, the beam that is scanned by the beam scanner 34 at the scan origin is converged by the beam collimator 36 including the electric field collimating lens and becomes parallel to the axis (the reference axis) of the deflection angle 0° parallel to the ion beam traveling direction (the beamline trajectory direction) before the scan operation. At this time, the scan region is formed so as to be bilaterally symmetrical to each other with respect to the reference axis.

As described above, the beam collimator 36 is configured to collimate the ion beam incident from the beam scanner 34 and forms at the downstream thereof a beam passing region extending along the x direction (the horizontal direction) perpendicular to the beam transportation direction on a plane perpendicular to the beam transportation direction. The beam collimator 36 is an electrostatic beam collimator, for example.

As illustrated in FIG. 1, the ion implanter 100 is provided with a beam energy measuring device 200. The beam energy measuring device 200 includes a parallelism measuring unit 202 and an energy calculating unit 204. The parallelism measuring unit 202 is configured to measure parallelism (hereinbelow referred to as "beam parallelism" or "parallelism") of the ion beam passing through the beam collimator 36 at the downstream of the beam collimator 36. The parallelism measuring unit 202 is provided in the processing chamber 21 adapted to perform the ion implantation process for the workpiece, for example.

Although the detail will be described below, the beam parallelism is an index representing a beam angle error in the ion beam. For example, as the beam parallelism, an index representing an error of the beam angle in the direction (the x direction) perpendicular to the beamline L1 on the aforementioned plane defined by the plurality of beam trajectories 37a, 37b, and 37c passing through the beam collimator 36 may be used. The beam parallelism according to the present embodiment represents a relative angle error between local parts of the ion beam rather than an entire angle error of the ion beam with respect to the beam reference trajectory in design.

The parallelism measuring unit 202 includes a divergence mask having a plurality of slits and a profiler cup measuring beam current, for example. The divergence mask intercepts a part of the scan beam collimated by the beam collimator 36 and allows the residual part of it pass through. The profiler cup is arranged away from the divergence mask by a predetermined distance L. The processing chamber 21 of the existing ion implanter 100 is usually provided with a beam current detector such as the profiler cup. By using such an existing detector, the beam energy measuring device 200 can be configured at low cost.

The parallelism measuring unit 202 measures beam current as a function of a position along the scan direction (the x direction). In an ideal case in which the center of the ion beam passing through the beam scanner 34 and the beam collimator 36 corresponds to the beamline L1, the parallelism measuring unit 202 may calculate the parallelism from a difference δx between a position at which the beam current is actually maximum and a position at which the beam is expected to be maximum in design and the predetermined distance L. The detail of the configuration for measurement of such parallelism will be described below.

The energy calculating unit 204 is configured to calculate energy of the ion beam from the measured parallelism. The energy calculating unit 204 calculates an energy deviation amount of the ion beam from the target beam energy based on the beam parallelism. The energy calculating unit 204 may be a part of the aforementioned control unit 120 or may be provided separately. Alternatively, the energy calculating unit 204 may be a part of a control device configured to control the ion implanter 100 or may be provided separately.

Meanwhile, since the beam collimator 36 collimates the ion beam as a result of deflection or convergence of the ion beam, a deflection force or a convergence force required to collimate the ion beam depends on energy possessed by the ion beam. That is, the larger the energy is, the larger the required deflection force or convergence force becomes. The deflection force or the convergence force of the beam collimator 36 varies depending on the electric input (e.g., voltage in a case of the electric field collimating lens 84) to the beam collimator 36.

Figure 5A:
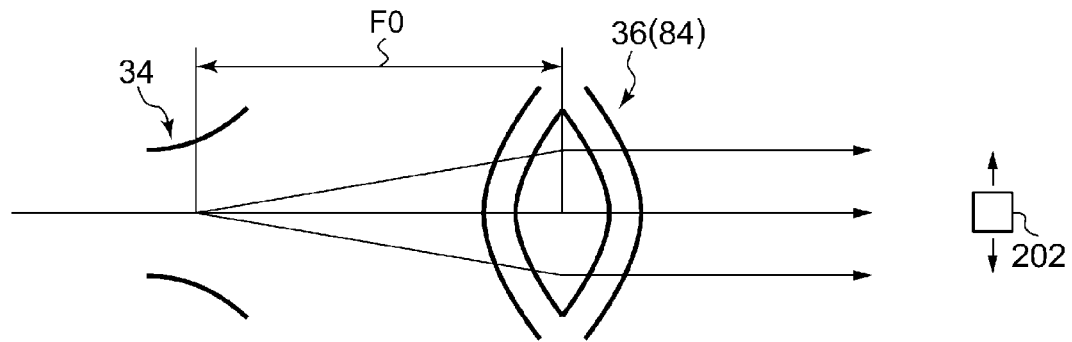
FIGS. 5A, 5B, and 5C illustrate measurement of beam parallelism according to an embodiment of the present invention.

Accordingly, in the ion implanter 100, preset setting of the beam collimator 36 correlating the target beam energy of the ion beam with the electric input to the beam collimator 36 required to collimate the ion beam is predetermined. The electric input determined based on this setting is given to the beam collimator 36 under the predetermined conditions of ion implantation (including the target beam energy), and the beam collimator 36 is operated. Thus, when energy of the ion beam incident to the beam collimator 36 corresponds to the target beam energy, the beam collimator 36 can collimate the ion beam completely as illustrated in FIG. 5A. The focal distance of the beam collimator 36 is represented as F0 in FIG. 5A.

However, in a case in which the energy of the ion beam differs from the target beam energy, the beam collimator 36 cannot collimate the ion beam completely under the setting in accordance with the target beam energy.

Figure 5B:
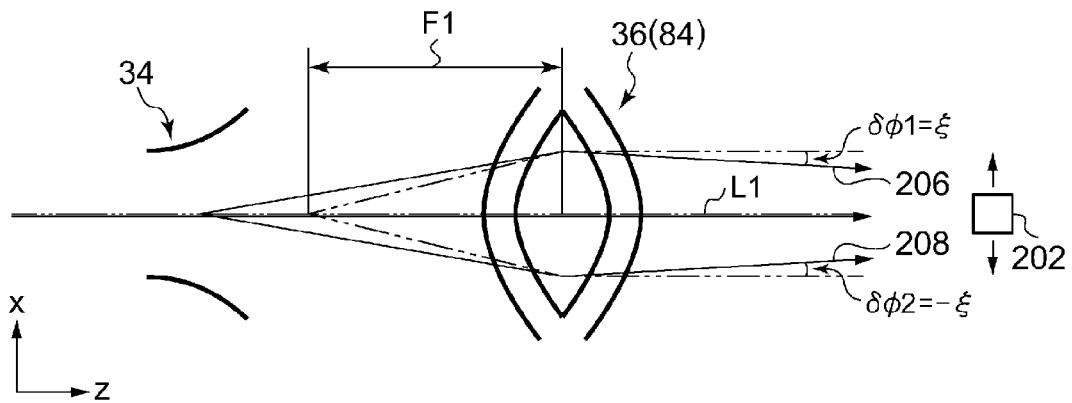
Figure 5C:
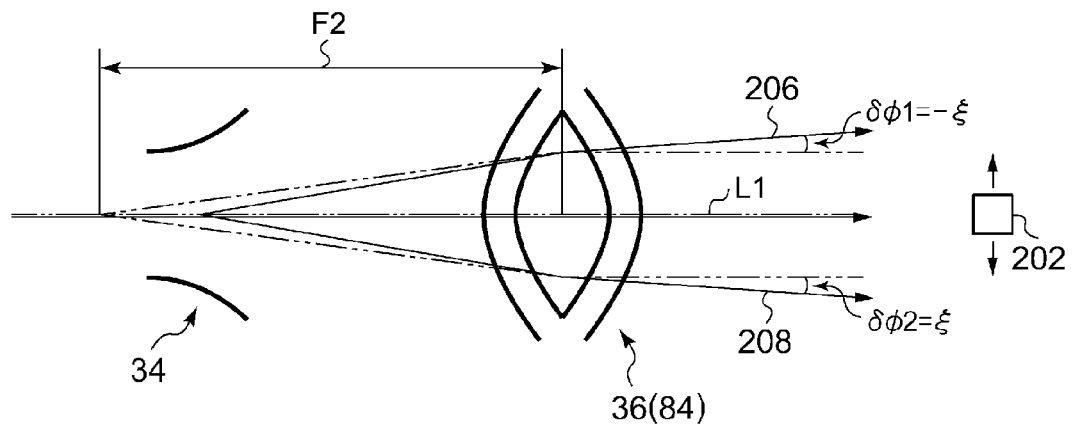

For example, in a case in which the energy of the ion beam is smaller than the target beam energy, the ion beam is excessively made to converge or deflected by the beam collimator 36, and the beam parallelism deviates from complete parallelism. This is equivalent to moving the focus F of the beam collimator 36 closer to the beam collimator 36 to shorten the focal distance (F1<F0) as illustrated in FIG. 5B. Also, in a case in which the energy of the ion beam is larger than the target beam energy, convergence or deflection of the ion beam by the beam collimator 36 is insufficient (the beam diverges), and the beam parallelism deviates from complete parallelism. This is equivalent to moving the focus F of the beam collimator 36 away from the beam collimator 36 to extend the focal distance (F2>F0) as illustrated in FIG. 5C.

This relationship between the energy deviation and the parallelism deviation can be derived through electric field calculation around the collimating lens 84 and trajectory calculation of the ion beam. Suppose the focal distance is p times when the energy is α times. In terms of a certain value for α, exiting angles from the collimating lens 84 respectively corresponding to several scan angles in the scan range of the beam scanner 34 can be calculated. From these scan angles (that is, the incident angles to the collimating lens 84) and exiting angles from the collimating lens 84, a focal distance ratio β corresponding to the energy ratio α can be derived. By deriving focal distance ratios β respectively corresponding to multiple values for the energy ratio α, relationship between the energy ratio α and the focal distance ratio β can be obtained. According to an analysis conducted by the present inventors, the energy ratio α and the focal distance β have linear relationship, which is expressed as α=A·β+B (A and B are constant numbers). This relationship does not depend on the scan angles. Since the focal distance ratio β is equivalent to the parallelism deviation, the energy ratio α can be calculated by measuring the parallelism.

For example, suppose, when the deflection angle (that is, the difference between the incident angle and the exiting angle) when the ion beam with the target beam energy E0 passes through the collimating lens 84 is Φ, an actual deflection angle is Φ+δΦ. In an ideal case in which the center of the ion beam corresponds to the beamline L1, the angle deviation δΦ can be used as the beam parallelism. The angle deviation δΦ is proportional to energy deviation δE. In other words, δE=E0×(δΦ/Φ) is established. The energy calculating unit 204 converts the measured beam parallelism (that is, the angle deviation δΦ) into the energy deviation amount 5E based on such known relationship.

The collimating lens 84 is designed precisely in advance to achieve the deflection angle Φ for collimating the ion beam with the target energy E0. Also, the parallelism is one of the main parameters for the implantation process, and the parallelism measuring unit 202 is thus configured to enable precise measurement of the parallelism (or δΦ). The target energy E0 is determined as a specification for the implantation process to be performed. Accordingly, the beam energy measuring device 200 can derive the energy deviation amount δE, that is, the energy E0+δE of the ion beam, accurately.

A specific example of measurement of the beam parallelism will be described with reference to FIGS. 5B and 5C. The parallelism measuring unit 202 measures beam angles in the direction (the x direction) perpendicular to the beam reference trajectory for a plurality of beam parts of the ion beam. The beam parallelism δΦ is defined with use of a difference between a beam angle δΦ1 of a first beam part 206 and a beam angle δΦ2 of a second beam part 208 out of the plurality of beam parts. For example, δ=(δΦ1−δΦ2)/2 is defined.

The first beam part 206 is situated at an outer edge portion of the ion beam in the x direction while the second beam part 208 is situated at an outer edge portion of the ion beam on the opposite side of the first beam part 206 in the x direction. The second beam part 208 is symmetric with the first beam part 206 about the beamline L1. The distance between the measurement points is desirably as large as possible in the x direction. The reason for this is that, in a case in which the ion beam converges or diverges in the beam collimator 36, the angular difference is larger when the measurement points are further away from each other. Thus, sensitivity of measurement is improved.

FIGS. 5B and 5C illustrate cases in which the center of the ion beam corresponds to the beamline L1, but in which the energy of the ion beam differs from the target beam energy. As illustrated in FIG. 5B, when $\delta\Phi1=-\delta\Phi2=\xi$, $\delta\Phi=(\xi-(-\xi))/2=\xi$. Also, as illustrated in FIG. 5C, when $\delta\Phi2=-\delta\Phi1=\xi$, $\delta\Phi=(-\xi-\xi)/2=-\xi$. The beam parallelism δΦ obtained in this manner is converted into the energy deviation δE, and by using this, the energy of the ion beam can be derived.

Figure 6:
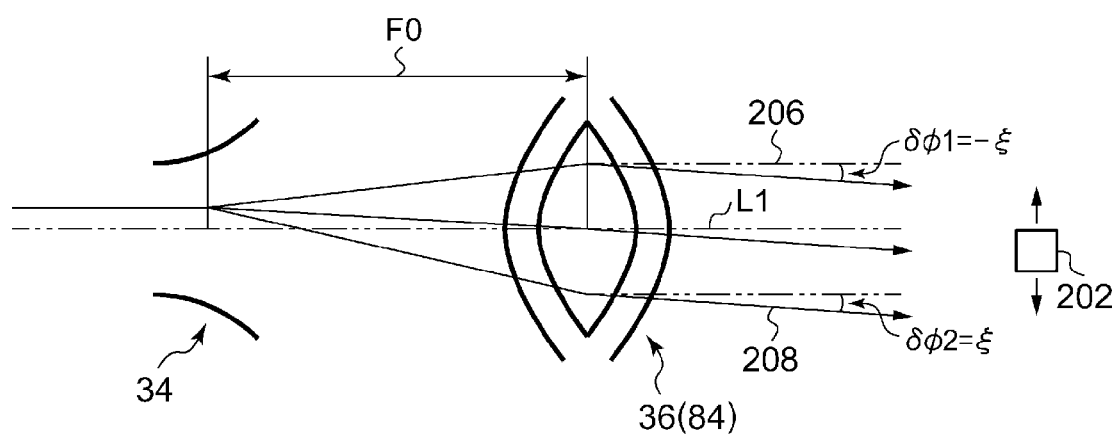
FIG. 6 illustrates measurement of beam parallelism according to an embodiment of the present invention.

On the other hand, FIG. 6 illustrates a case in which the energy of the ion beam corresponds to the target beam energy, but in which the center of the ion beam deviates from the beamline L1. As illustrated in FIG. 6, when $\delta\Phi1=\delta\Phi2=\xi$, $\delta\Phi=(\xi-\xi)/2=0$. Since the beam parallelism δΦ is zero, the energy deviation δE is zero as well. That is, the first beam part 206 and the second beam part 208 have no energy deviation, and the energy of the ion beam corresponds to the target beam energy.

Since the beam parallelism δΦ is zero, the first beam part 206 and the second beam part 208 are collimated by the beam collimator 36. However, as is apparent from FIG. 6, since the ion beam deviates from the beamline L1 at the upstream of the beam collimator 36, the first beam part 206 and the second beam part 208 respectively deviate (are inclined) from the beam trajectory in design at the downstream of the beam collimator 36 as well.

It is possible to use an amount defined by a beam angle at a certain measurement point as the beam parallelism. However, in this case, in a case in which the ion beam deviates from the beamline L1 as illustrated in FIG. 6, an error resulting from such trajectory deviation will be included in the measured beam angle. Consequently, inaccurate beam parallelism will be obtained. In this case, energy deviation obtained therefrom will also be inaccurate.

Conversely, as illustrated in FIGS. 5B and 5C, by using as the beam parallelism an amount defined by a beam angle difference between two measurement points, the aforementioned error resulting from the trajectory deviation can be eliminated. The error resulting from the trajectory deviation is common between local parts of the ion beam. In other words, due to trajectory deviation at the upstream of the beam collimator 36, the same angle deviation occurs at any beam part at the downstream of the beam collimator 36. Accordingly, by obtaining a difference of the measured beam angles, an error included in one measured beam angle and an error included in the other measured beam angle can be set off. In this manner, relative angle deviation between beam parts can be clarified accurately.

Figure 7B:
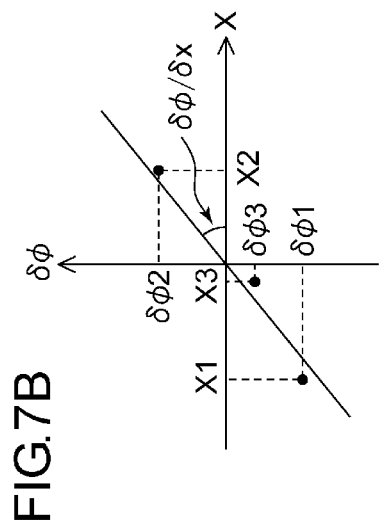
FIGS. 7A and 7B illustrate measurement of beam parallelism according to an embodiment of the present invention.
Figure 7A:
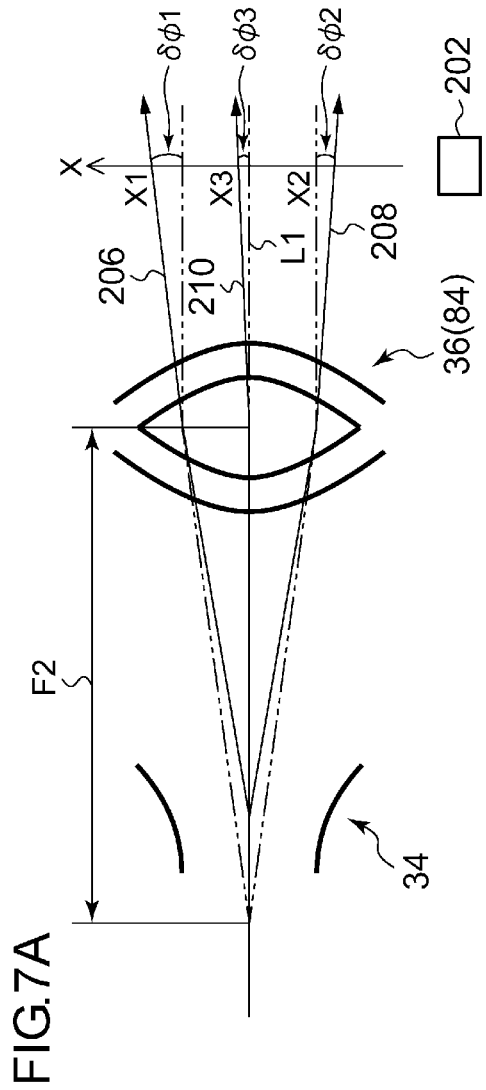

The number of measurement points for the beam angle may be three or more. The parallelism measuring unit 202 may measure the beam angles of the first beam part 206, the second beam part 208, and a third beam part 210. As illustrated in FIG. 7A, the first beam part 206 and the second beam part 208 may be situated on the opposite sides from each other in the x direction as described above, and the third beam part 210 may be situated close to the center of the ion beam. Measurement positions in the x direction of the first beam part 206, the second beam part 208, and the third beam part 210 by the parallelism measuring unit 202 are set as X1, X2, and X3, respectively.

The parallelism measuring unit 202 generates an error distribution of the x-direction beam angles relative to the x-direction positions based on three beam angles δΦ1, δΦ2, and δΦ3 measured. The error distribution is derived by means of a known arbitrary method (e.g., a least-square method). The error distribution is illustrated in FIG. 7B. The beam parallelism can be defined with use of a ratio of a difference δx of the x-direction position to a corresponding difference δΦ of the x-direction beam angle in this error distribution. For example, the beam parallelism may be defined as a ratio δΦ/δx. That is, the beam parallelism is an angle difference per unit length in the x direction, which is a slope of the error distribution.

When the ion beam has trajectory deviation, the three measured beam angles δΦ1, δΦ2, and δΦ3 increase or decrease equally in accordance with the deviation amount. This is equivalent to parallel shift of the error distribution illustrated in FIG. 7B. That is, the slope of the error distribution is invariable. Thus, by defining the beam parallelism with use of the ratio δΦ/δx, an error caused by the trajectory deviation can be eliminated from the beam parallelism.

It is to be noted that such error distribution may be generated in a case in which the number of measurement points for the beam angle is two. In this case, the ratio δΦ/δx may be calculated from the x-direction measurement positions and the corresponding x-direction beam angle measurement values of the two beam parts.

As described with reference to FIG. 1, the ion implanter 100 includes the high energy multistage linear acceleration unit 14, the energy analyzer electromagnet 24, and the energy analyzer slit 28. In principle, acceleration by the high energy multistage linear acceleration unit 14 gives energy distribution to the ion beam. The ion implanter 100 is designed so that the center of the energy distribution corresponds to the center of the slit in a case in which the high energy multistage linear acceleration unit 14 is operated with appropriate parameters. The beam energy after passing of the slit becomes the target beam energy.

However, in a case in which the high energy multistage linear acceleration unit 14 is operated with slightly different parameters from the appropriate parameters, the energy of the ion beam slightly increases/decreases due to the parameter difference. In this case, the deflection angle of the ion beam provided by the energy analyzer electromagnet 24 is changed, and the center of the energy distribution of the ion beam deviates from the center of the energy analyzer slit 28. In the case in which the beam center deviates from the slit center, the beam energy after passing through the slit deviates from the target beam energy along with the deviation.

Based on the above, the energy of the ion beam measured by the energy calculating unit 204 may be used to control the high energy multistage linear acceleration unit 14. For example, the control unit 120 may control the high energy multistage linear acceleration unit 14 based on the measured energy of the ion beam so that the ion beam has the target energy.

In this case, the control unit 120 may control the voltage amplitude V [kV] in at least one radio frequency resonator 14a. Controlling the voltage is equivalent to direct operation of the energy of the ion beam. Preferably, at least one radio frequency resonator 14a includes a last-stage radio frequency resonator. By controlling the voltage in the last-stage radio frequency resonator, the energy of the ion beam can be controlled easily.

Alternatively, the control unit 120 may control a phase φ [deg] of radio frequency in at least one radio frequency resonator 14a. By controlling the phase, the ratio of energy received when the beam is accelerated can be changed.

By doing so, the beam energy can be controlled accurately. Thus, for example, the implantation depth to the substrate W can be controlled precisely.

The control unit 120 may determine whether or not the measured energy deviation amount exceeds a predetermined first threshold. The control unit 120 may control the high energy multistage linear acceleration unit 14 so that the high energy multistage linear acceleration unit 14 corrects the energy of the ion beam to make it closer to the target beam energy in a case in which the energy deviation amount exceeds the first threshold. The control unit 120 may determine the energy of the ion beam falls within an acceptable range in a case in which the energy deviation amount does not exceed the first threshold.

Also, the control unit 120 may determine whether or not the measured energy deviation amount exceeds a predetermined second threshold. The control unit 120 may interrupt the ion implantation process in a case in which the energy deviation amount exceeds the second threshold. The second threshold may be larger than the first threshold. The second threshold may be equal to the first threshold. The control unit 120 may select interruption of the ion implantation process or correction of energy deviation in a case in which the measured energy deviation amount exceeds the predetermined threshold.

Meanwhile, the control unit 120 may determine whether or not the energy of the ion beam derived from the energy deviation amount falls within a predetermined acceptable range, instead of comparing the energy deviation amount with the threshold. Also, instead of the control unit 120, another control device associated with the ion implanter 100 may execute these determinations.

Figure 8:
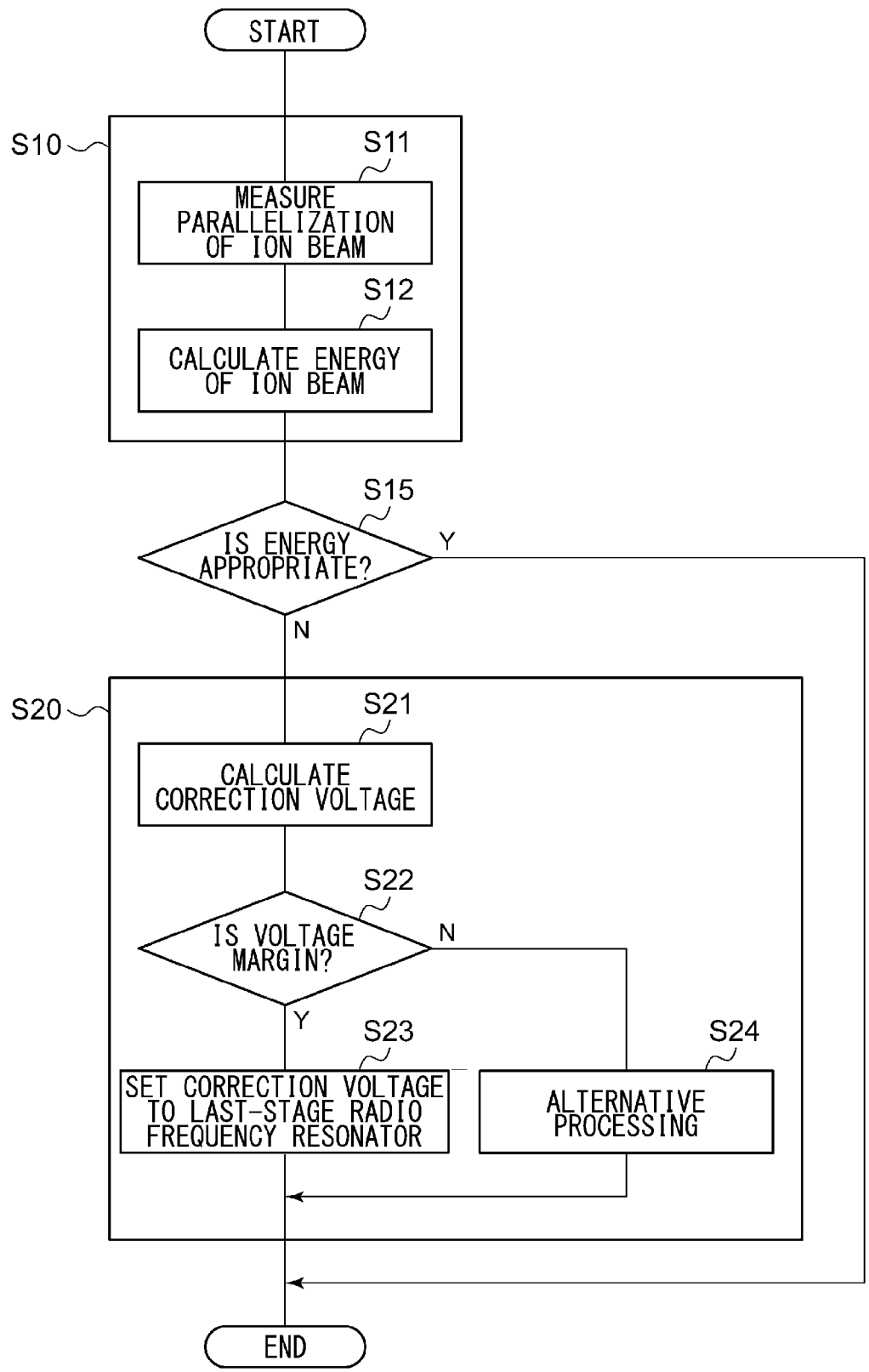
FIG. 8 is a flowchart illustrating a method of measuring a beam according to an embodiment of the present invention.

FIG. 8 is a flowchart illustrating a method of measuring a beam according to an embodiment of the present invention. This beam measurement method includes an energy measurement step (S10) and a control step (S20). This method is repeatedly executed with predetermined frequency in a preparation process for the ion implantation process.

In the energy measurement step (S10), the parallelism of the ion beam is measured at the downstream of the beam collimator 36 of the ion implanter 100 with use of the parallelism measuring unit 202 of the beam energy measuring device 200 (S11). Subsequently, the energy of the ion beam is calculated from the measured parallelism with use of the energy calculating unit 204 of the beam energy measuring device 200 (S12).

The beam energy measuring device 200 or the control unit 120 determines whether or not the calculated energy of the ion beam is appropriate (S15). For example, when the calculated energy corresponds to the target energy, or when the calculated energy falls within an acceptable range close to the target energy, the energy of the ion beam is determined to be appropriate. In a case in which the calculated energy is appropriate (Y in S15), control of the energy is not required, and this method ends. In a case in which the calculated energy is not appropriate (N in S15), the control step (S20) is executed.

In the control step (S20), based on the calculated energy of the ion beam, the high energy multistage linear acceleration unit 14 in the ion implanter 100 is controlled so that the ion beam has the target energy. The high energy multistage linear acceleration unit 14 is controlled by the control unit 120.

First, based on the calculated energy of the ion beam, correction voltage is calculated (S21). The correction voltage is a correction amount for RF acceleration voltage in the last-stage radio frequency resonator to provide the ion beam with the target energy. Subsequently, the control unit 120 confirms a voltage margin of the last-stage radio frequency resonator (S22). That is, it is determined whether or not the last-stage radio frequency resonator can additionally generate the correction voltage. In a case in which the voltage margin exceeds the correction voltage (Y in S22), the last-stage radio frequency resonator is set to generate the additional correction voltage (S23). In this manner, the energy of the ion beam is controlled appropriately, and this method ends. It is to be noted that, after the last-stage radio frequency resonator is set to generate the correction voltage, the energy measurement step (S10) may be executed to determine again whether or not the calculated energy of the ion beam is appropriate (S15).

On the other hand, in a case in which the voltage margin of the last-stage radio frequency resonator is less than the correction voltage (N in S22), alternative processing in order to provide the ion beam with the target energy is performed (S24). For example, phase control is performed in at least one radio frequency resonator 14a. Alternatively, the RF acceleration voltage in a radio frequency resonator other than the last-stage radio frequency resonator may be controlled. Such alternative processing and setting of a part of the correction voltage to the last-stage radio frequency resonator may be combined to provide the ion beam with the target energy. In this manner, this method ends. After such control, the energy measurement step (S10) may be executed to determine again whether or not the calculated energy of the ion beam is appropriate (S15).

Figure 9:
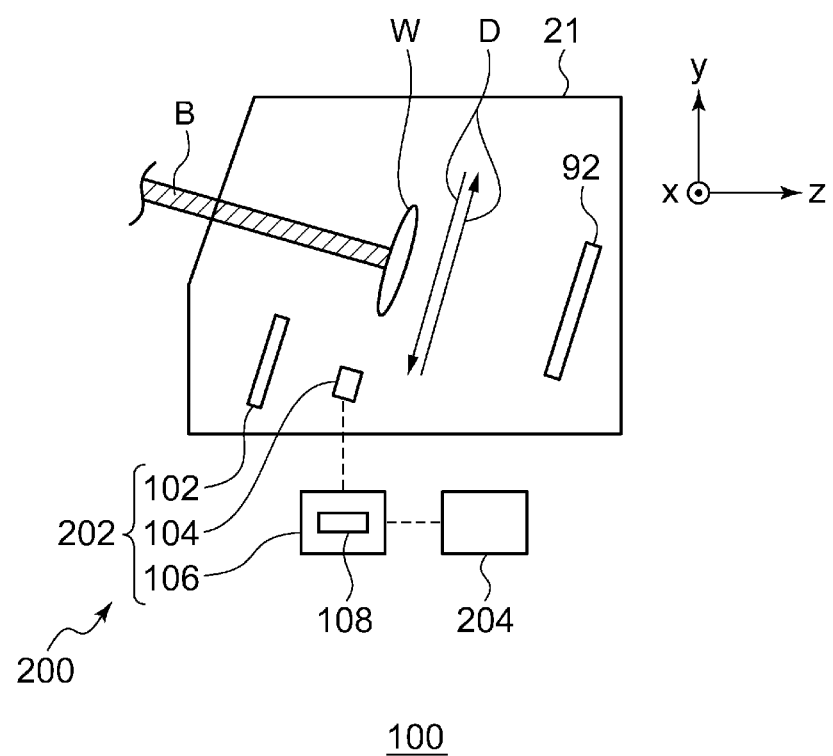
FIG. 9 schematically illustrates an example of a beam energy measuring device according to an embodiment of the present invention.

FIG. 9 schematically illustrates an example of the beam energy measuring device 200 according to an embodiment of the present invention. As described above, the ion implanter 100 is configured to perform an ion implantation process for the surface of the workpiece W. The workpiece W, for example, is a substrate such as a semiconductor wafer. Thus, hereinafter, for the convenience of description, while the workpiece W may be referred to as a substrate W, it does not intend to limit the target of the implantation process to a specific object.

The ion implanter 100 is configured to irradiate the entire substrate W with the ion beam B by using at least one of beam scanning and mechanical scanning. For example, the ion implanter 100 is configured to irradiate the entire substrate W with the ion beam B which scans the substrate W reciprocated mechanically. Here, for the convenience of description, the traveling direction of the ion beam B in design is defined as a z direction, and a plane that is perpendicular to the z direction is defined as an xy plane. As will be described below, in a case in which the ion beam B is scanned with respect to the workpiece W, the scanning direction is defined as an x direction, and a direction that is perpendicular to the z direction and the x direction is defined as a y direction. Accordingly, the beam scans the workpiece W in the x direction, and the workpiece W is mechanically reciprocated in the y direction.

The processing chamber 21 includes an object holder (not illustrated in the figure) configured to hold one or more substrates W and to provide relative movement (so-called mechanical scanning) of the substrate W with respect to the ion beam B, for example, in the y direction, as is necessary. In FIG. 9, the mechanical scanning is denoted by arrows D as an example. In addition, the processing chamber 21 includes a beam stopper 92. In a case in which the substrate W is not present on the ion beam B, the ion beam B is incident on the beam stopper 92.

The processing chamber 21 is provided with the beam energy measuring device 200. The beam energy measuring device 200 includes the parallelism measuring unit 202 and the energy calculating unit 204 as described above. The parallelism measuring unit 202 includes a mask 102 that is used for shaping the original ion beam B into a measuring ion beam Bm and a detection unit 104 that is configured to detect the measuring ion beam Bm.

As illustrated in FIG. 9, when the ion beam B is irradiated onto the substrate W, the mask 102 and the detection unit 104 are located at retreat positions away from the ion beam B. At this time, the ion beam B is not irradiated on the mask 102 and the detection unit 104. At the time of measurement, the mask 102 and the detection unit 104 are moved to measurement positions (refer to FIG. 10) traversing the ion beam B by a moving mechanism not illustrated in the figure. At this time, the mask 102 is located between the final energy filter 38 (refer to FIG. 1) and the detection unit 104 on the path of the ion beam B, and the detection unit 104 is located at a position in the z direction at which the surface of the substrate W is placed during the ion implantation process.

In addition, the parallelism measuring unit 202 includes a measurement control unit 106 that is used for performing an ion beam measuring process. The measurement control unit 106 may be configured as a part of the control device that is configured to control the ion implanter 100 or may be configured to be separate from the control device. The energy calculating unit 204 may be configured as apart of the measurement control unit 106 or may be configured to be separate from the measurement control unit 106. The measurement control unit 106 may be configured to control the movement of the mask 102 and the detection unit 104 between the retreat positions and the measurement positions described above. In an embodiment, the ion implanter 100 may be configured to control the ion implantation process based on a measurement result acquired by the parallelism measuring unit 202.

The measurement control unit 106 includes a beam angle calculating unit 108 that is configured to calculate an angle formed by the actual traveling direction of the ion beam B with respect to the z direction that is the designed traveling direction based on the output of the detection unit 104 that represents a detection result. The beam angle calculating unit 108 is configured to calculate an x-direction beam angle using the x-direction position of a beam part Bm to be measured by the detection unit 104 that has passed through a y slit 110y and calculate a y-direction beam angle using the y-direction position of a beam part Bm to be measured by the detection unit 104 that has passed through an x slit 110x.

Figure 10:
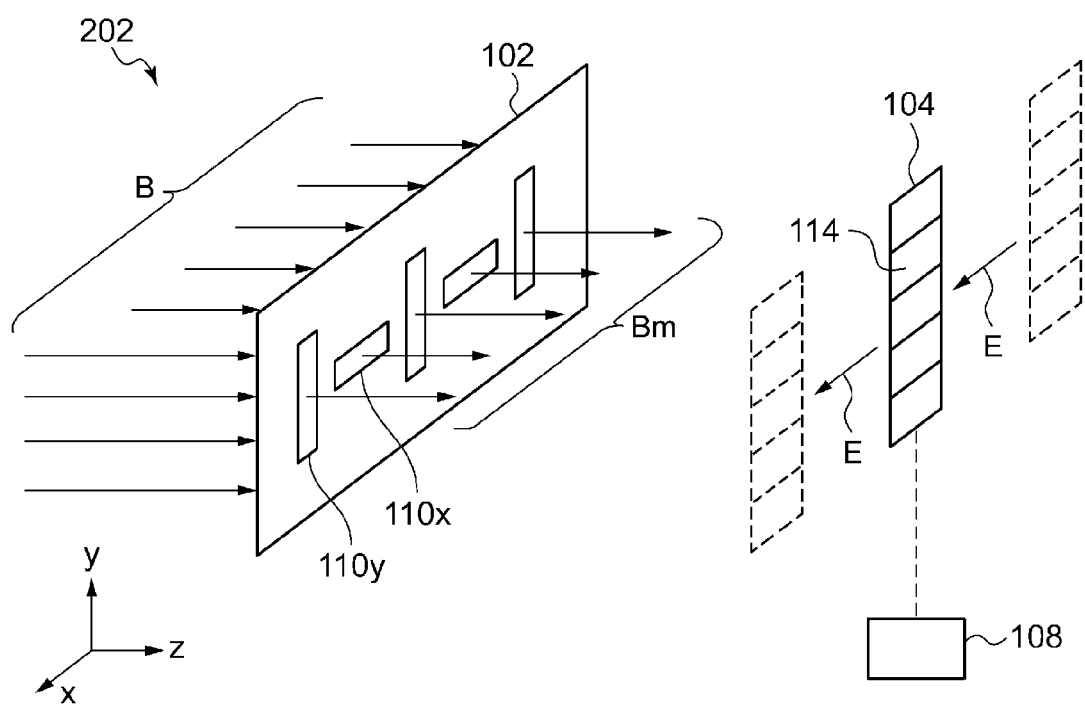
FIG. 10 is a schematic diagram that illustrates a parallelism measuring unit illustrated in FIG. 9.
Figure 11:
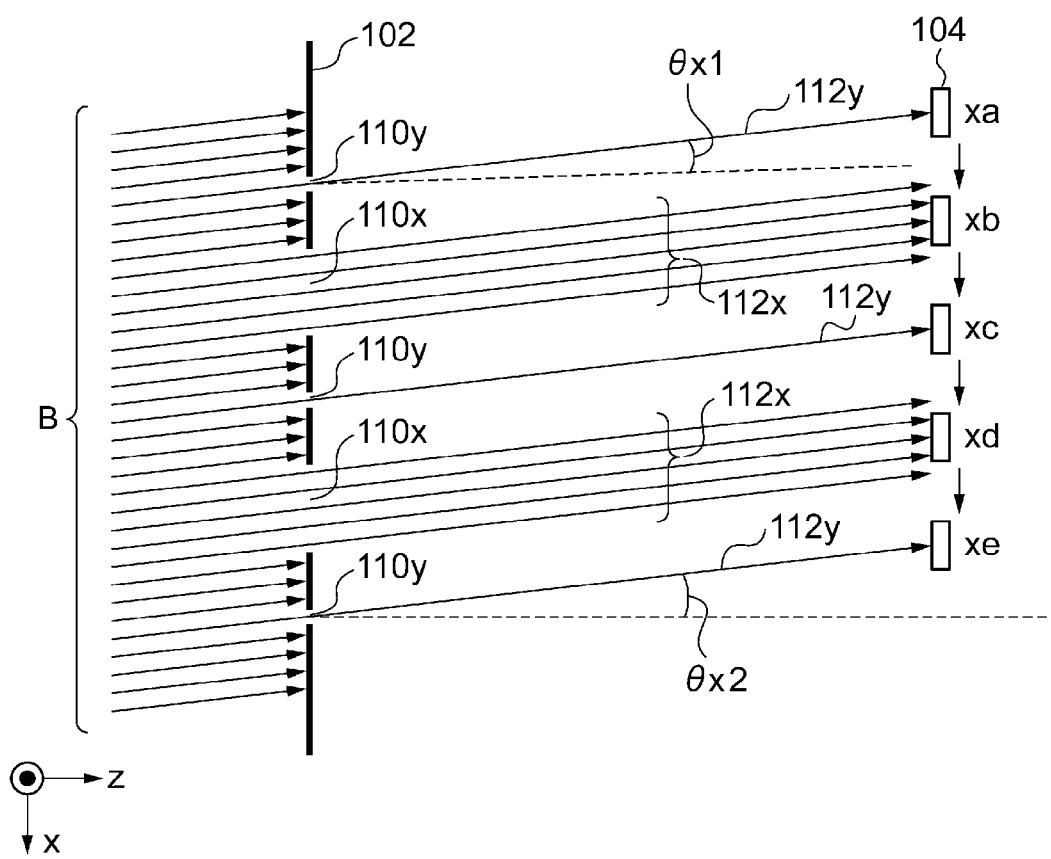
FIG. 11 is a diagram that is acquired when the parallelism measuring unit illustrated in FIG. 10 is cut at the center of a mask in a y direction and is viewed in the y direction.
Figure 12:
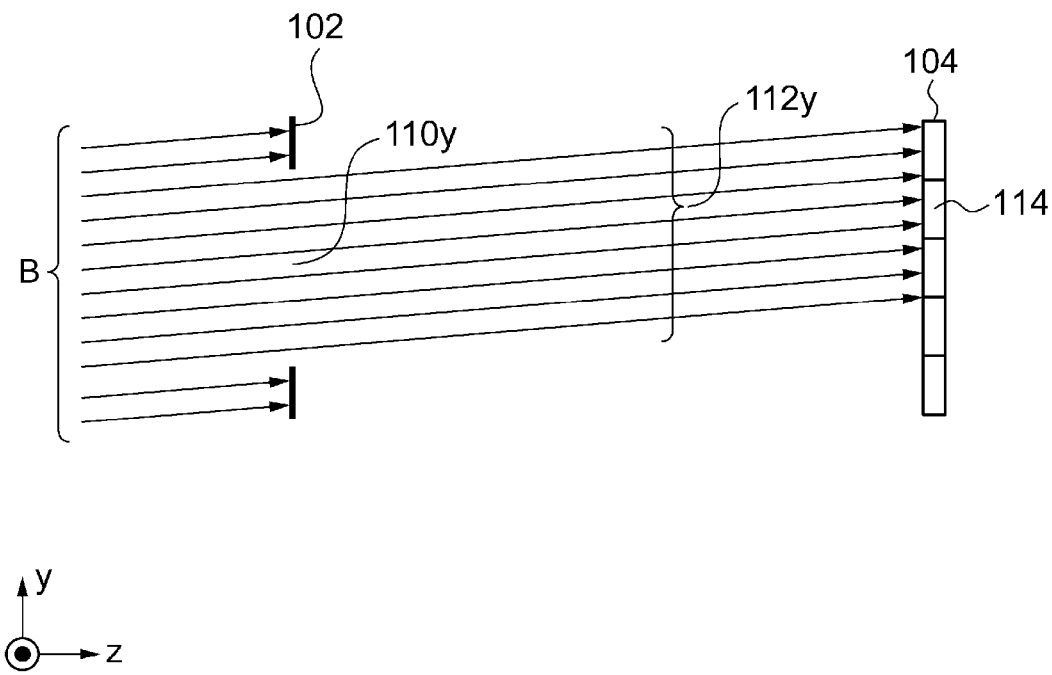
FIG. 12 is a diagram that is acquired when the parallelism measuring unit illustrated in FIG. 10 is cut at a position of a y slit of the mask in an x direction and is viewed in the x direction.

FIG. 10 is a schematic diagram that illustrates the parallelism measuring unit 202 illustrated in FIG. 9. FIG. 11 is a diagram that is acquired when the parallelism measuring unit 202 illustrated in FIG. 10 is cut at the center of the mask 102 in the y direction and is viewed in the y direction. FIG. 12 is a diagram that is acquired when the parallelism measuring unit 202 illustrated in FIG. 10 is cut at a position of the y slit 110y of the mask 102 in the x direction and is viewed in the x direction. FIG. 13 is a diagram that is acquired when the parallelism measuring unit 202 illustrated in FIG. 10 is cut at a position of the x slit 110x of the mask 102 in the x direction and is viewed in the x direction.

The mask 102 is configured to intercept a part of the ion beam B traveling from the upstream side and allow the residual part of it, which is the measuring ion beam Bm, pass through thereof. The measuring ion beam Bm includes the y beam part 112y and the x beam part 112x (see FIGS. 11 to 13). The y beam part 112y has a cross-section elongated in the y direction on the xy plane. In addition, the x beam part 112x has a cross-section elongated in the x direction on the xy plane.

The mask 102 includes a plate-shaped member having a plurality of slits or openings to allow the ion beam B to pass therethrough. The plurality of slits formed on the mask 102 include a y slit 110y that are elongated in the y direction and a x slit 110x that are elongated in the x direction. In description presented here, a portion of the mask 102 in which the y slit 110y is formed may be referred to as a "first mask part" and a portion of the mask 102 in which the x slit 110x is formed may be referred to as a "second mask part".

The mask 102 illustrated in FIG. 10 includes three first mask parts and two second mask parts in an irradiated region on the mask 102 on which the original ion beam B is incident. Such first mask parts and second mask parts are alternately arranged in the x direction. Each first mask part includes one y slit 110y, and each second mask part includes one x slit 110x.

Accordingly, the mask 102 includes three y slits 110y and two x slits 110x, and the y slits 110y and the x slits 110x are arranged alternately in the x direction. The center y slit 110y is located at the center of the irradiated region on the mask 102 in the x direction on which the ion beam B is incident. The remaining two y slits 110y are located at the end portions of the irradiated region on the mask 102 in the x direction. Meanwhile, the two x slits 110x are located at the same position in the y direction that is at the center of the irradiated region on the mask 102 in the y direction.

The y slit 110y is a through hole having a shape corresponding to the y beam part 112y. Accordingly, the y slit 110y has a certain narrow slit width in the x direction and a slit length longer than the slit width in the y direction. On the other hand, the x slit 110x is a through hole having a shape corresponding to the x beam part 112x. Accordingly, the x slit 110x has a certain narrow slit width in the y direction and a slit length longer than the slit width in the x direction.

The slit lengths of the y slit 110y and the x slit 110x are markedly longer than the slit widths thereof, and, for example, the slit length is at least ten times the slit width. It is preferable to narrow the slit width in a case where the precision of the measurement is significant, and it is preferable to broaden the slit width in a case where the shortening of the measurement time is significant. The slit length of the y slit 110y is determined in accordance with the width of the ion beam B in the y direction.

In addition, in the mask 102, a gap between two adjacent slits is determined such that two adjacent beam parts of the measuring ion beam Bm corresponding to the adjacent slits are separate from each other when the measuring ion beam Bm is incident on the detection unit 104. As illustrated in FIG. 11, a gap between the y slit 110y and the x slit 110x adjacent to each other in the x direction is determined such that the y beam part 112y and the x beam part 112x adjacent to each other do not overlap each other at a position of the detection unit 104 in the z direction. By doing this, mixing of the beam parts adjacent to each other due to divergence of each beam part until the arrival of each beam part at the detection unit 104 from the mask 102 can be avoided.

The ion beam B is irradiated to the first mask part and a part of it passes through the y slit 110y, which is the y beam part 112y. In addition, the ion beam B is irradiated to the second mask part and a part of it passes through the x slit 110x, which is the x beam part 112x. In accordance with the arrangement of the y slits 110y and the x slits 110x on the mask 102, a measuring ion beam Bm in which three y beam parts 112y and two x beam parts 112x are alternately arranged in the x direction is generated.

The mask 102 stays while detection is performed by the detection unit 104. Accordingly, the y beam part 112y and the x beam part 112x correspond to specific parts cut out from the original ion beam B. Accordingly, the y beam part 112y and the x beam part 112x maintain beam angles at specific positions of the ion beam B in the xy plane.

The detection unit 104 is configured to detect an x-direction position of the y beam part 112y and an y-direction position of the x beam part 112x. The detection unit 104 includes a moving detector that is movable in the x direction so as to traverse the measuring ion beam Bm. The movement of the detection unit 104 in the x direction is denoted by arrows E in FIG. 10 as an example. In accordance with the movement of the detector in the x direction, the position of the y beam part 112y in the x direction is detected. In addition, the detection unit 104 includes a plurality of detection elements 114 arranged in the y direction. Based on the arrival position of the x beam part 112x in the detection unit 104, the position of the x beam part 112x in the y direction is detected.

In this way, the detection unit 104 can detect the position of the y beam part 112y in the x direction and the position of the x beam part 112x in the y direction while the moving detector traverses the measuring ion beam Bm once.

The detection unit 104 or each detection element 114, for example, includes an element that generates a current based on the amount of incident ions or may have any configuration for detecting an ion beam. The detection unit 104 or each detection element 114, for example, may be a Faraday cup. Here, while five detection elements 114 are representatively exemplified in the detection unit 104 illustrated in the figure, the detection unit 104, typically, may include an array of detection elements 114 which has five or more (for example, at least ten) detection elements 114.

As illustrated in FIG. 11, when the detection unit 104 moves in the x direction for detecting the measuring ion beam Bm, for example, at a position xa in the x direction, the detection unit 104 receives the y beam part 112y from the y slit 110y that is located at the end portion in the x direction on the mask 102. In addition, the detection unit 104, for example, at a position xb in the x direction, receives the x beam part 112x from one x slit 110x. Furthermore, the detection unit 104, for example, at a position xc in the x direction, receives the y beam part 112y from the y slit 110y located at the center in the x direction. Similarly, the detection unit 104, for example, at a position xd in the x direction, receives the x beam part 112x from the other x slit 110x and, for example, at a position xe in the x direction, receives the y beam part 112y from the y slit 110y located at the end portion in the x direction.

The detection unit 104 outputs relation between the position in the x direction and the beam current that are acquired as a result of the movement in the x direction to the beam angle calculating unit 108. The beam angle calculating unit 108 identifies the position of the y beam part 112y in the x direction based on the relation between the position in the x direction and the beam current. The beam angle calculating unit 108, for example, determines the position of peak of the beam current in the x direction that corresponds to the y beam part 112y as the position of the y beam part 112y in the x direction.

As illustrated in FIG. 12, the y beam part 112y is incident over several detection elements 114 aligned in the y direction. Thus, in this embodiment, beam currents output from individual detection elements 114 are added together, and the total beam current is used for identifying the position of the y beam part 112y in the x direction.

As is known, an x-direction beam angle θx can be calculated based on the ratio between an x-direction beam displacement amount between first and second positions in the z direction and a distance between the first and second positions in the z direction. Since the mask 102 is maintained at a defined place during detection, the position of each slit on the mask 102 in the z direction and the position of each slit within the xy plane at the z-direction position are known. In addition, the position of the detection unit 104 in the z direction is known. Accordingly, by using these known positional relations and the detected position of the y beam part 112y in the x direction, the x-direction beam angle θx can be calculated.

Here, the beam parallelism may be defined as an angular difference δθ=θx1−θx2 between two measurement points, for example. The distance between the measurement points is desirably as large as possible in the scan plane. The reason for this is that, in a case in which the beam trajectory becomes a convergence trajectory or a divergence trajectory, the angular difference is larger when the measurement points are further away from each other. Thus, sensitivity of measurement is improved.

The width of the y beam part 112y in the x direction, as illustrated in FIG. 11, is made narrower than the width of the y slit 110y in the x direction. Accordingly, the position of the peak of a beam current that corresponds to the y beam part 112y in the x direction can be easily specified. In addition, the y beam part 112y, as illustrated in FIG. 12, has a large width in the y direction in correspondence with the y slit 110y. Accordingly, a beam current received by the detection unit 104 can be configured to be higher than that of a case where a mask having small circular holes is used as in the conventional case.

Similarly, a y-direction beam angle θy can be calculated based on the ratio between a y-direction beam displacement amount between the first and second positions in the z direction and a distance between the first and second positions in the z direction. As illustrated in FIG. 13, the width of the x beam part 112x in the y direction is made narrower than the width of the x slit 110x in the y direction. The x beam part 112x arrives at a specific detection element 114 of the detection unit 104, and the position of the detection element 114 in the y direction can be regarded as the position of the x beam part 112x in the y direction. The y-direction beam angle θy can be calculated by using the position of the x beam part 112x in the y direction, which has been detected as above, and the known positional relation between the mask 102 and the detection unit 104. As illustrated in FIG. 11, since the x beam part 112x has a larger width in the x direction than the x slit 110x, a beam current received by the detection unit 104 can be configured to be high.

As above, by forming the x-direction slits and the y-direction slits in one mask 102, the x-direction beam angle θx and the y-direction beam angle θy can be measured at the same time by using one mask 102.

By disposing the plurality of y slits 110y at positions that are different from each other in the x direction, a distribution of x-direction beam angles θx of the ion beam B in the x direction can be acquired. For example, the x-direction beam angle θx acquired from the y beam part 112y located at the center can be used as a representative value of the x-direction beam angle of the ion beam B. In addition, as an index representing the uniformity of the x-direction beam angle θx, for example, a difference between this representative value and the x-direction beam angle θx acquired from the y beam part 112y located at the end portion can be used.

In addition, by disposing the plurality of x slits 110x at positions that are different from each other in the x direction, a distribution of the y-direction beam angles θy of the ion beam B in the x direction can be acquired.

In the above-described embodiment, the detection unit 104 moves in the x direction at a constant speed. In this case, there is an advantage of simplifying the operation of the detection unit 104. However, in an embodiment, in order to increase the amount of the beam current received by the detection unit 104, the detection unit 104 may be configured to adjust the movement speed of the moving detector while the moving detector traverses the measuring ion beam Bm once. For example, the moving detector may reduce the speed or stop so as to receive the x beam part 112x. More specifically, for example, the moving detector may reduce the speed right before the reception of the x beam part 112x and continue the reduced speed until passing through the x beam part 112x. Alternatively, the moving detector may stop for a predetermined time at a position receiving the x beam part 112x.

Figure 14:
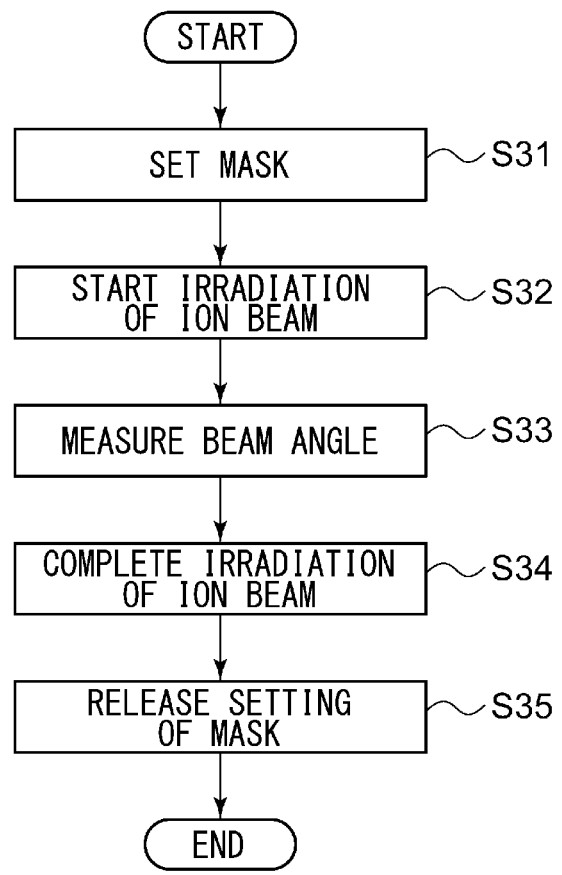
FIG. 14 is a flowchart for describing an example of a parallelism measuring process using the parallelism measuring unit illustrated in FIG. 9.

FIG. 14 is a flowchart for describing an example of a parallelism measuring process using the parallelism measuring unit 202 illustrated in FIG. 9. First, a mask is set at a position through which an ion beam passes (S31). This operation is mechanically performed. In the mask, y slits and x slits are disposed as described above. Thereafter, until the process of this method ends, the mask is maintained at the position, and the mask is stopped during the measurement.

Next, the irradiation of the ion beam starts in Step S32. The ion beam passes through slits of the mask, whereby a measuring ion beam is prepared. The measuring ion beam, as described above, includes a y beam part elongated in the y direction that is perpendicular to the traveling direction of the ion beam and an x beam part elongated in the x direction that is perpendicular to the traveling direction and the y direction.

Subsequently, the beam angle is measured (S33). An arrival position of the ion beam that has passed through the mask is measured by using the detection unit. The position of the y beam part in the x direction is detected, and the position of the x beam part in the y direction is detected. At this time, the detection unit is moved with respect to the measuring ion beam as is necessary. An x-direction beam angle (that is, parallelism) is calculated using the detected x-direction position, and a y-direction beam angle is calculated using the detected y-direction position. Thereafter, the irradiation of the ion beam ends (S34), and finally, the set of the mask is released (S35). The mask is returned to the retreat position. In this way, the process of this method ends.

Described above is an explanation based on the exemplary embodiments of the present invention. The invention is not limited to the above-mentioned embodiments, and various design modifications may be added. It will be obvious to those skilled in the art that such modifications are also within the scope of the present invention.

Although the ion implanter 100 includes the electrostatic beam collimator 36 in the above embodiment, the present invention is not limited to this. In an embodiment, the ion implanter 100 may include a magnetic field type beam collimator. In this case, by replacing the voltage in the above description with a magnetic field, energy can be measured in a similar manner.

Also, in an embodiment, the measured energy of the ion beam may be used to control a component of the ion implanter 100 other than the high energy multistage linear acceleration unit 14.

In an embodiment, the ion implanter 100 may be configured to supply an ion beam having a longer cross-section in a direction perpendicular to the z direction, which may also be referred to as a ribbon beam, to the processing chamber 21. In such a case, for example, the ion beam has an x-direction width that is longer than a y-direction width thereof. Accordingly, the beam energy measuring device may include a parallelism measuring unit that measures parallelism of the ribbon beam at the downstream of the beam collimator and an energy calculating unit that calculates energy of the ion beam from the measured parallelism.

It should be understood that the invention is not limited to the above-described embodiment, but may be modified into various forms on the basis of the spirit of the invention. Additionally, the modifications are included in the scope of the invention.

What is claimed is:

1. An ion implanter comprising:
   a beam collimator that has a focus on a beam reference trajectory and deflects a plurality of beam trajectories, directed from the focus to the beam collimator at different respective incident angles on a plane containing the beam reference trajectory, at different deflection angles in accordance with the respective incident angles so that each of the plurality of beam trajectories is parallel to the beam reference trajectory under a target beam energy;
   a parallelism measuring unit that measures a beam parallelism, representing an error of a beam angle in a direction in the plane, the direction being perpendicular to the beam reference trajectory, of an ion beam passing through the beam collimator at a downstream of the beam collimator; and
   an energy calculating unit that calculates an energy deviation amount of the ion beam from the target beam energy based on the beam parallelism.

2. The ion implanter according to claim 1, wherein the parallelism measuring unit measures, for each of a plurality of beam parts of the ion beam, the beam angle in the direction in the plane and perpendicular to the beam reference trajectory.

3. The ion implanter according to claim 2, wherein the beam parallelism is defined with use of a difference between a first beam angle of a first beam part and a second beam angle of a second beam part out of the plurality of beam parts.

4. The ion implanter according to claim 2, wherein the plurality of beam parts are at least three beam parts including a first beam part, a second beam part, and a third beam part,
   wherein the parallelism measuring unit generates an error distribution of beam angle in relation to measuring positions in the direction based on at least three beam angles measured, and
   wherein the beam parallelism is defined with use of a ratio of a difference between the measuring positions to a corresponding difference of beam angle in the error distribution.

5. The ion implanter according to claim 3, wherein the first beam part is situated at an outer edge portion of the ion beam in the direction while the second beam part is situated at an outer edge portion of the ion beam opposite to the first beam part in the direction.

6. The ion implanter according to claim 1, wherein the energy calculating unit calculates the energy deviation amount from the beam parallelism based on a known relationship defined with use of the target beam energy.

7. The ion implanter according to claim 1, further comprising:
   a high energy multistage linear acceleration unit arranged upstream of the beam collimator and including a plurality of stages of radio frequency resonators; and a control unit that controls the high energy multistage linear acceleration unit based on the calculated energy deviation amount of the ion beam so that the ion beam has the target beam energy.

8. The ion implanter according to claim 7, wherein the control unit controls voltage amplitude in at least one radio frequency resonator.

9. The ion implanter according to claim 8, wherein the at least one radio frequency resonator includes a last-stage radio frequency resonator.

10. The ion implanter according to claim 7, wherein the control unit controls a phase of radio frequency in at least one radio frequency resonator.

11. The ion implanter according to claim 1, wherein,
when the direction in the plane and perpendicular to the beam reference trajectory is referred to as an x direction, and a direction perpendicular to the beam reference trajectory and the x direction is referred to as a y direction,
the beam collimator forms at a downstream thereof a beam passing region extending along the x direction,
the parallelism measuring unit includes a mask that is used for shaping the ion beam into a measuring beam having a y beam part elongated in the y direction, and
the parallelism measuring unit detects a position of the y beam part in the x direction and determines the beam parallelism from the detected x-direction position.

12. The ion implanter according to claim 1, further comprising:
a beam scanner arranged upstream of the beam collimator.

13. The ion implanter according to claim 1, wherein the parallelism measuring unit is provided in a processing chamber adapted to perform an ion implantation process for a workpiece.

14. The ion implanter according to claim 1, wherein the beam collimator is an electrostatic beam collimator.

15. The ion implanter according to claim 1, wherein the beam collimator is a magnetic field type beam collimator.

16. The ion implanter according to claim 1, wherein the ion implanter is configured to interrupt anion implantation process in a case in which the energy deviation amount exceeds a predetermined threshold.

17. The ion implanter according to claim 1, wherein the ion implanter is configured to correct an energy of the ion beam toward the target beam energy in a case in which the energy deviation amount exceeds a predetermined threshold.

18. A beam energy measuring device in an ion implanter comprising:
a parallelism measuring unit that measures a beam parallelism at a downstream of a beam collimator of the ion implanter; and
an energy calculating unit that calculates an energy deviation amount of an ion beam from a target beam energy based on the beam parallelism and a known relationship defined with use of the target beam energy.

19. A method of measuring beam energy comprising:
measuring a beam parallelism at a downstream of a beam collimator in an ion implanter; and
calculating an energy deviation amount of an ion beam from a target beam energy based on the beam parallelism and a known relationship defined with use of the target beam energy.

20. The method of measuring beam energy according to claim 19, further comprising:
interrupting anion implantation process in a case in which the energy deviation amount exceeds a predetermined threshold.

21. The method of measuring beam energy according to claim 19, further comprising:
correcting an energy of the ion beam toward the target beam energy in a case in which the energy deviation amount exceeds a predetermined threshold.

* * * * *